(12) United States Patent
Dennison

(10) Patent No.: US 6,261,948 B1
(45) Date of Patent: Jul. 17, 2001

(54) METHOD OF FORMING CONTACT OPENINGS

(75) Inventor: Charles H. Dennison, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/285,322

(22) Filed: Apr. 2, 1999

Related U.S. Application Data

(62) Division of application No. 09/127,577, filed on Jul. 31, 1998, now Pat. No. 6,140,219.

(51) Int. Cl.$^7$ ............................................. H01L 21/4763
(52) U.S. Cl. ......................................................... 438/637
(58) Field of Search ........................... 438/637, 638–641, 438/657, 673, 666

(56) References Cited

U.S. PATENT DOCUMENTS

| | | | |
|---|---|---|---|
| 4,281,448 | 8/1981 | Barry et al. | 29/577 C |
| 4,936,928 | 6/1990 | Shaw et al. | 148/33.4 |
| 5,162,890 | 11/1992 | Butler | 257/306 |
| 5,166,096 | 11/1992 | Cote et al. | 437/195 |
| 5,173,752 | 12/1992 | Motonami et al. | 257/309 |
| 5,206,187 | 4/1993 | Doan et al. | 437/192 |
| 5,243,219 | 9/1993 | Katayama | 287/740 |
| 5,272,367 | 12/1993 | Dennison et al. | 257/306 |
| 5,317,193 | 5/1994 | Watanabe | 257/774 |
| 5,444,003 | 8/1995 | Wang et al. | 437/31 |
| 5,510,648 | 4/1996 | Davies et al. | 257/657 |
| 5,547,892 | 8/1996 | Wuu et al. | 438/152 |
| 5,552,620 | 9/1996 | Lu et al. | 257/302 |
| 5,576,243 | 11/1996 | Wuu et al. | 438/154 |
| 5,591,662 | 1/1997 | Zambrano | 437/57 |
| 5,612,240 | 3/1997 | Chang | 438/297 |
| 5,652,174 | 7/1997 | Wuu et al. | 438/238 |
| 5,668,021 | 9/1997 | Subramanian et al. | 438/282 |
| 5,686,331 | 11/1997 | Song | 437/41 |
| 5,707,883 | 1/1998 | Tabara | 437/40 GS |
| 5,710,450 | 1/1998 | Chau et al. | 257/344 |
| 5,731,610 | 3/1998 | Rhodes | 257/309 |
| 5,736,441 | 4/1998 | Chen | 438/255 |

(List continued on next page.)

OTHER PUBLICATIONS

Wolf, S., "Silicon Processing for the VLSI Era", vol. 3: The Submicron MOSFET, Lattice Press 1995, pp. 136–138, 232–234, 634–646.

Gray, Paul R. et al., "Analysis and Design of Analog Integrated Circuits," Third Edition, 1993, John Wiley and Sons, p. 169—specifically the $2^{nd}$ paragraph.

U.S. application No. 08/399,844, Rhodes, filed Mar. 7, 1995.

Shenai, K., "A high–density, self–aligned power MOSFET structure fabricated using sacrificial spacer technology" Electron Devices, IEEE Transaction on Electron Devices, vol. 39 Issue 5, May 1992, pps 1252–1255.

*Primary Examiner*—Tuan H. Nguyen
*Assistant Examiner*—Craig Thompson
(74) *Attorney, Agent, or Firm*—Wells, St. John, Roberts, Gregory & Matkin

(57) ABSTRACT

A method for forming a contact opening is described and which includes providing a node location to which electrical connection is to be made; forming a conductive line adjacent the node location, the conductive line having a conductive top and sidewall surfaces; forming electrically insulative oxide in covering relation relative to the top surface of the conductive line; forming electrically insulative nitride sidewall spacers over the conductive sidewall surfaces, the nitride sidewall spacers projecting outwardly of the conductive line top conductive surface, the electrically insulative oxide positioned between the nitride sidewall spacers; forming an electrically insulative layer outwardly of the conductive line, and the node location; and etching a contact opening to the node location or the top surface through the electrically insulative layer substantially selective relative to the nitride sidewall spacers.

37 Claims, 4 Drawing Sheets

U.S. PATENT DOCUMENTS

| | | | |
|---|---|---|---|
| 5,747,359 | 5/1998 | Yuan et al. | 437/186 |
| 5,763,321 | 6/1998 | Ohshima et al. | 438/618 |
| 5,811,350 | 9/1998 | Dennison | 438/597 |
| 5,827,770 | 10/1998 | Rhodes et al. | 438/396 |
| 5,858,832 | 1/1999 | Pan | 438/230 |
| 5,864,155 | 1/1999 | Melzner | 257/306 |
| 5,866,927 | 2/1999 | Cho et al. | 257/296 |
| 5,874,359 * | 2/1999 | Liaw et al. | 438/640 |
| 5,885,890 | 3/1999 | Dennison | 438/597 |
| 5,891,780 | 4/1999 | Hasegawa et al. | 438/278 |
| 5,895,269 | 4/1999 | Wang et al. . | |
| 5,897,350 | 4/1999 | Lee et al. | 438/238 |
| 5,899,712 | 5/1999 | Choi et al. | 438/163 |
| 5,912,492 | 6/1999 | Chang et al. | 257/344 |
| 5,930,618 | 7/1999 | Sun et al. | 438/240 |
| 5,946,578 | 8/1999 | Fujii | 438/300 |
| 5,960,318 | 9/1999 | Peschke et al. | 438/637 |
| 5,970,360 | 10/1999 | Cheng et al. | 438/398 |
| 6,093,609 | 7/2000 | Chuang . | |
| 6,097,103 | 8/2000 | Ishigaki . | |
| 6,133,103 | 10/2000 | Lee et al. . | |

* cited by examiner

METHOD OF FORMING CONTACT OPENINGS

RELATED PATENT DATA

This application is a divisional application resulting from a continuation of U.S. patent application Ser. No. 09/127,577, which was filed Jul. 31, 1998; which resulted from U.S. Pat. No. 5,811,350 issued Sep. 22, 1998 is now U.S. Pat. No. 6,140,219.

TECHNICAL FIELD

This invention relates generally to a method of forming contact openings and to electronic components formed from the same and other methods.

BACKGROUND OF THE INVENTION

As various electronic components such as DRAMS have increased in memory cell density, designers face a continuous challenge to provide contact openings to predetermined node locations, and to the top surface of conductive lines.

Heretofore, so-called self-aligned contact openings are provided to node locations which are adjacent to wordlines, by first encapsulating the wordline in nitride spacers, and providing a nitride cap thereover. Once this is achieved, a silicon dioxide layer in the form of BPSG, is provided over the encapsulated wordline. Following the provision of the layer of BPSG, the contact opening is etched. In view of perceived shortcomings in the prior art techniques, the patterning and etching of the contact openings through the layer of BPSG to the node location, can be somewhat misaligned. To address this problem, an etching chemistry is provided which is selective to nitride and therefore the etching will stop on the nitride material which encapsulates the wordline.

In addition to the foregoing, the fabrication of certain electronic components may require that contact openings be made to both the top surface of the respective wordlines and to substrate areas adjacent thereto. To make electrical contact to the top surface of wordlines, the prior art techniques have typically included separate photo patterning, and etching steps. The present method provides a convenient means by which contact openings to the top surface of the wordline, and adjacent node location can be provided in a single photo masking and etching step.

BRIEF DESCRIPTION OF THE DRAWINGS

Preferred embodiments of the invention are described below with reference to the following accompanying drawings.

SUMMARY OF THE INVENTION

The invention provides methods for forming a contact opening to the top surface of an electronic component, and an adjacent node location in the same masking step, as well as an electronic component formed from the same methods.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Preferred embodiments of the present invention are collectively shown by the accompanying drawings as will become apparent from the continuing discussion.

Figure 1:
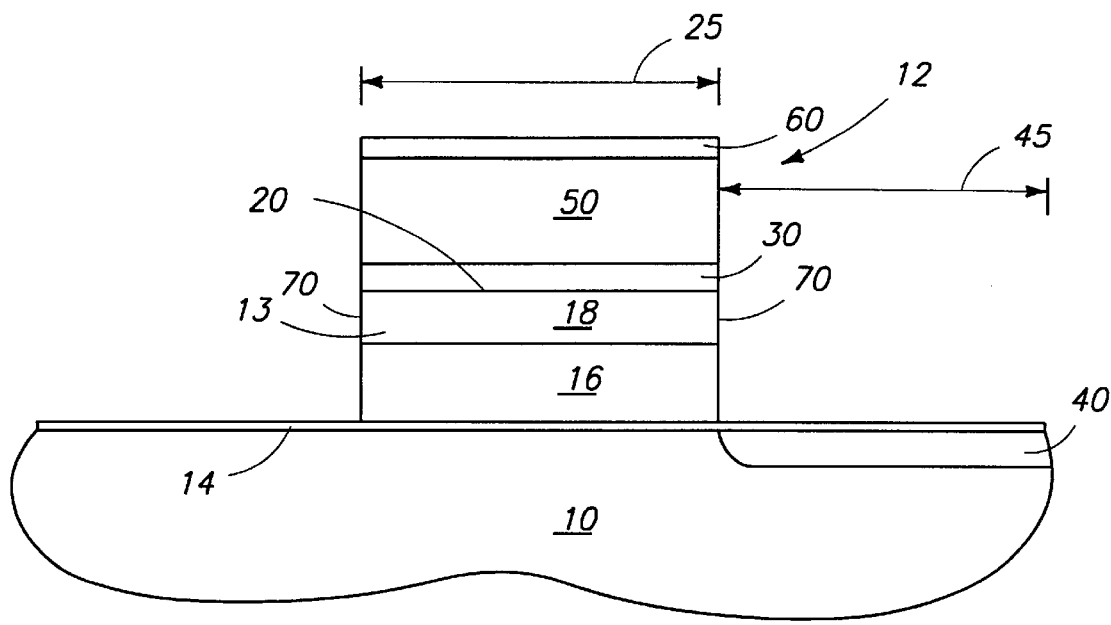
FIG. 1 is a diagrammatic section of a semiconductor wafer shown at one processing step in accordance with the present invention.

Referring first to FIG. 1, a semiconductive wafer in process is indicated generally by reference to numeral 10. An electronic component or conductive line 12 having a main body 13 is provided, as shown. The electronic component or conductive line 12 is positioned over a gate oxide layer 14. The electronic component 12 includes a layer of conductive material 16, which is provided over the gate layer 14, and which comprises polysilicon. A tungsten silicide layer 18 is provided over the polysilicon layer 16. The tungsten silicide layer has an outwardly facing surface 20 which forms the top of the conductive line or electronic component 12. The conductive line or electronic component 12, as provided, has a given photomasking target area identified by the line labeled 25.

An oxide layer 30 is formed over the top or outwardly facing surface 20 of the conductive line of electronic component 12. Still further, a node location 40 in the form of a diffusion region is provided adjacent the conductive line or electronic component 12. The node location may comprise LDD implants or boron halo implants which are not shown. As will be recognized, the node locations 40 has a given target area identified by the line labeled 45.

A disposable, sacrificial, first material layer 50 preferably comprising polysilicon is formed over the oxide layer 30. Still further, an optional layer of nitride 60 having a thickness of approximately 100 Angstroms is formed over the disposable, sacrificial, first material layer. The nitride layer 60 serves to protect the underlying sacrificial first material layer from oxidation during reoxidation of the adjacent node location 40. Each of the respective layers 16, 18, 30, and 50, have substantially coplanar sidewalls 70.

Figure 2:
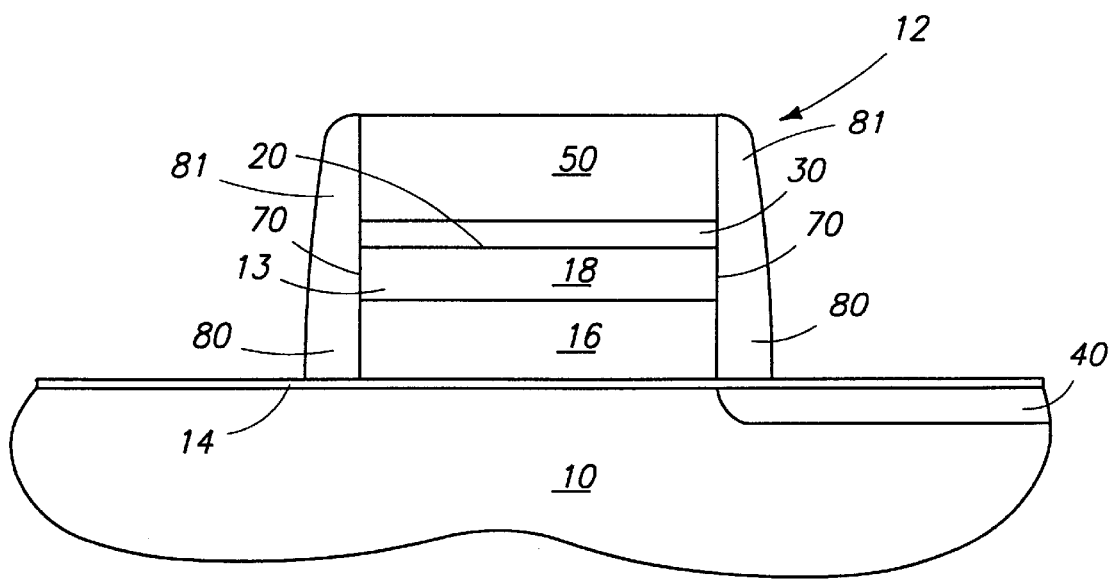
FIG. 2 is a diagrammatic section of the FIG. 1 wafer illustrated at a processing step subsequent to that shown by FIG. 1.

Referring now to FIG. 2, a first pair of electrically insulative anisotropically etched nitride spacers 80 are formed in covering relation relative to the sidewalls 70. The insulative spacers 80 have a portion 81 which is disposed outwardly relative to the top surface 20 of the conductive line or electronic component 12. The sacrificial, or first material layer 50 is disposed in covering relation relative to the top surface 20 of the electronic component 12, and is further positioned between the first pair of insulative spacers 80.

Figure 3:
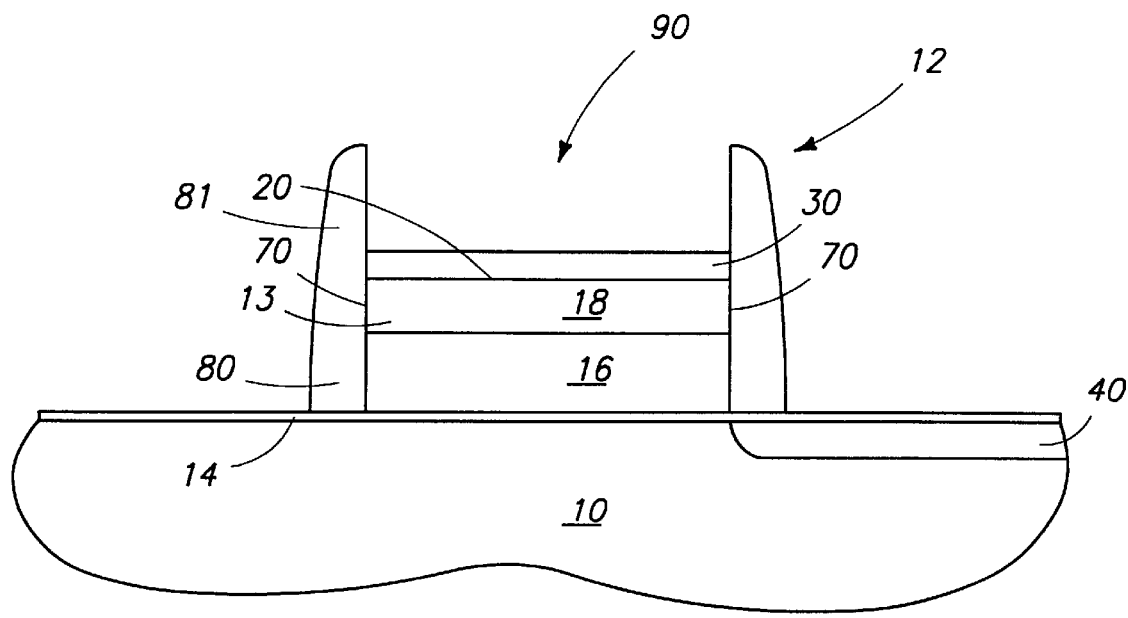
FIG. 3 is a diagrammatic section of the FIG. 1 wafer illustrated at a processing step subsequent to that shown by FIG. 2.

Referring now to FIG. 3, the conductive line or electronic component 12 is shown following the selective removal or etching of the sacrificial, or first layer of material 50. The selective etching of the sacrificial layer 50 results in an elevational void 90 being formed, or otherwise defined between the first pair of nitride spacers 80.

Figure 4:
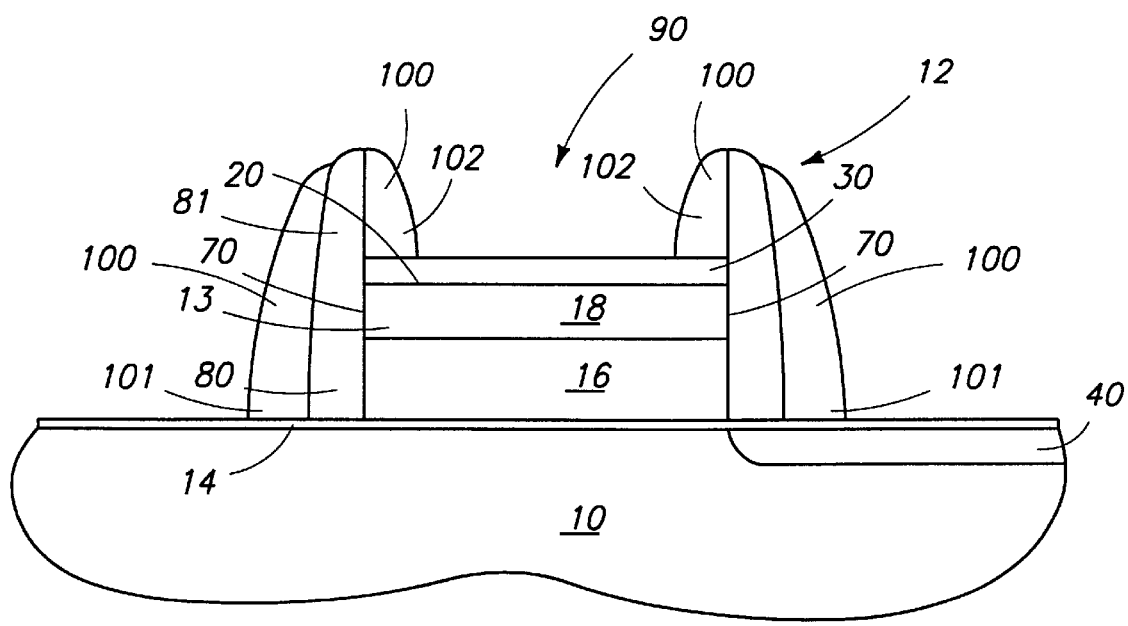
FIG. 4 is a diagrammatic section of the FIG. 1 wafer illustrated at a processing step subsequent to that shown by FIG. 3.

Referring now to FIG. 4, the conductive line or electronic component 12 is shown following the provision of a second nitride layer, which has been subsequently selectively etched to provide secondary, electrically insulative spacers 100. The secondary spacers 100 are disposed, on the one hand, in opposing covering relation relative to the top surface 20; and on the other hand in partial covering relation relative to the first pair of nitride spacers 80, and the underlying semiconductor wafer 10. The secondary nitride spacers 100 include a first pair of nitride spacers 101, which are disposed laterally, outwardly relative to the first pair of nitride spacers 80; and a second pair of nitride spacers 102, which are disposed in partial covering relation relative to the top surface 20 of the conductive line 12, and laterally inwardly relative to the first pair of nitride spacers 80. Following the provisions of the secondary spacers 100, optional $n^+$ and $p^+$ implants can be provided if desired. Further, it will be seen by a study of FIGS. 1 and 4, that the provision of the secondary nitride spacers 102 increases the mask misalignment area for hitting the node location 40 by the width of spacers 102. It will be recognized, therefore, that misalignment of a subsequent mask for making contact to the node location 40 in a dimension of less than or equal to the dimension of the width of spacers 102, will not result in making electrical contact to the underlying electronic component 12. Further, it will also be recognized that the secondary nitride spacers 101 provide an analogous added mask misalignment dimension equal to the width of spacers 101 when targeting for the top surface 20.

Figure 5:
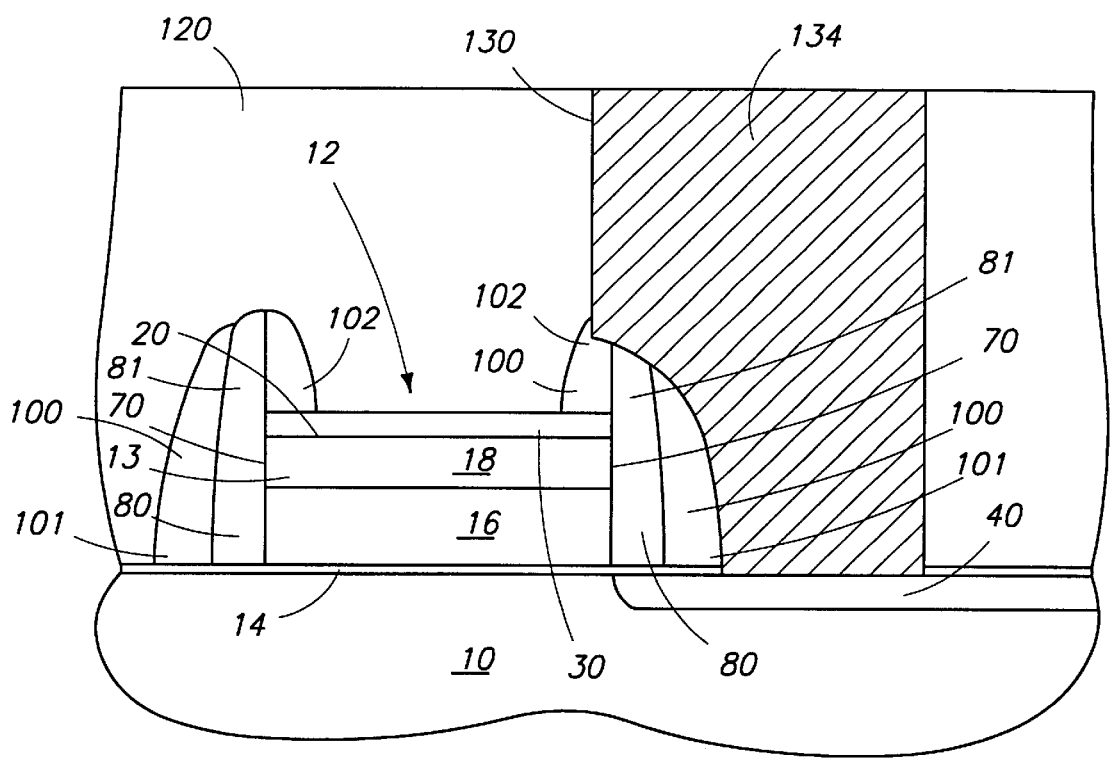
FIG. 5 is a diagrammatic section of the FIG. 1 wafer illustrated at a processing step subsequent to that shown by FIG. 4.
Figure 6:
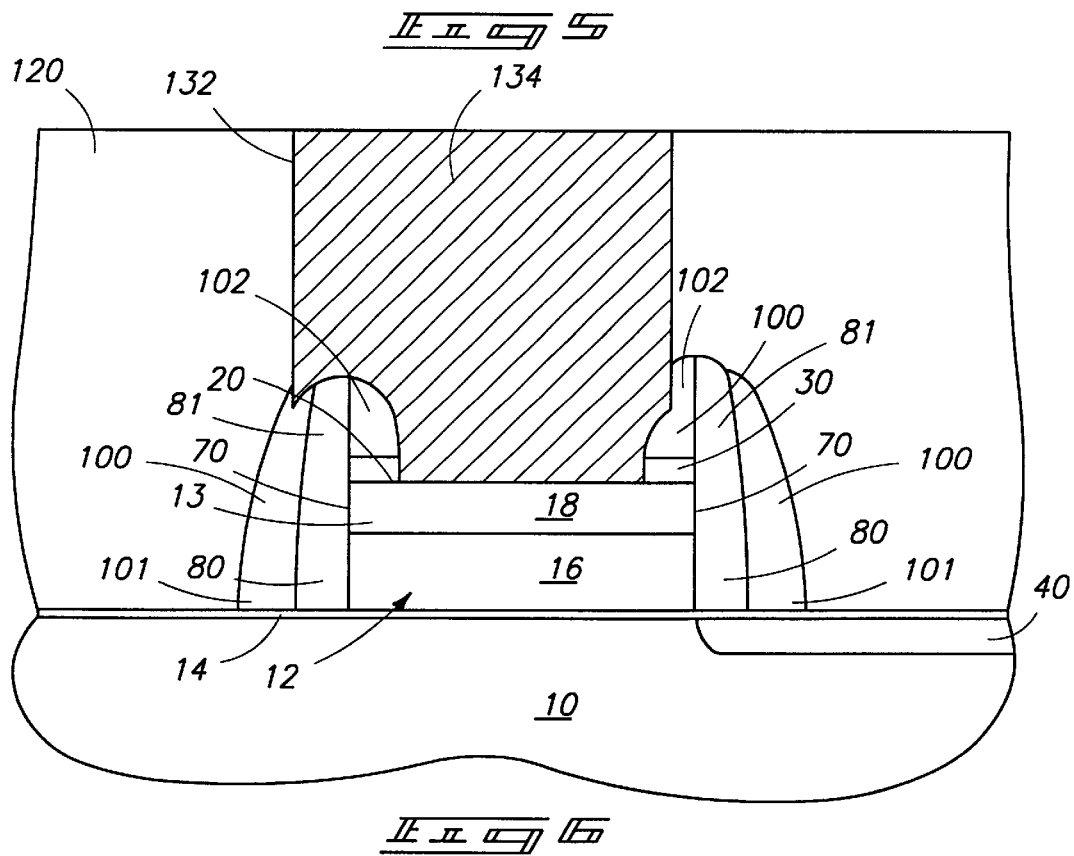
FIG. 6 is a diagrammatic section of the FIG. 1 wafer taken through a different plane from that depicted by FIGS. 1–5, and corresponds in sequence to the processing depicted by FIG. 5.

Referring now to FIGS. 5, and 6, a second layer of insulative material 120, preferably comprising BPSG, is provided in covering relation relative to the electronic component 12, and the underlying semiconductor wafer 10. FIGS. 5 and 6 are different parallel plane cross-sectional cuts. Following the provision of the insulative layer 120, and in the same masking step, first and second contact openings 132 and 130 are provided, as desired, to the node location 40 (FIG. 5), and to the top surface 20 of the conductive line 12 respectively (FIG. 6). As shown and discussed above, the provision of the secondary nitride spacers 101 and 102 allows for some misalignment of the respective contact openings 130 and 132 to the underlying node location 40 or top surface 20. Following the provision of the individual contact openings 130 and 132, electrically conductive material 134 is provided therein.

As seen in FIG. 6, therefore, the present method for forming a contact opening 130 to an electronic component 12 includes forming an electronic component 12, having a top surface 20; forming an electrically insulative spacer 102 in partial covering relation relative to the top surface 20; forming an insulating layer 120 over the spacer 102 and top surface 20; and selectively etching the insulative layer 120 relative to the spacer 102 to form a contact opening to the electronic component top surface 20.

Figure 7:
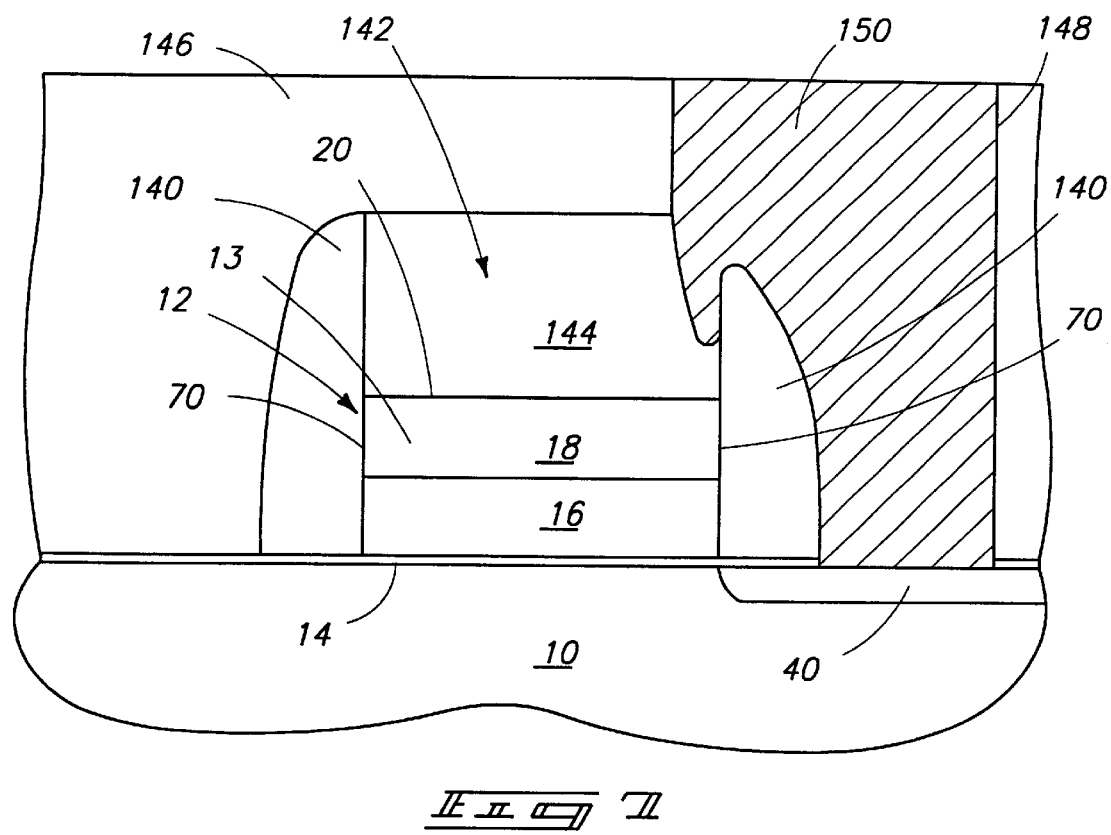
FIG. 7 is a diagrammatic section of the FIG. 1 wafer illustrated at an alternate processing step subsequent to that shown in FIG. 1.
Figure 8:
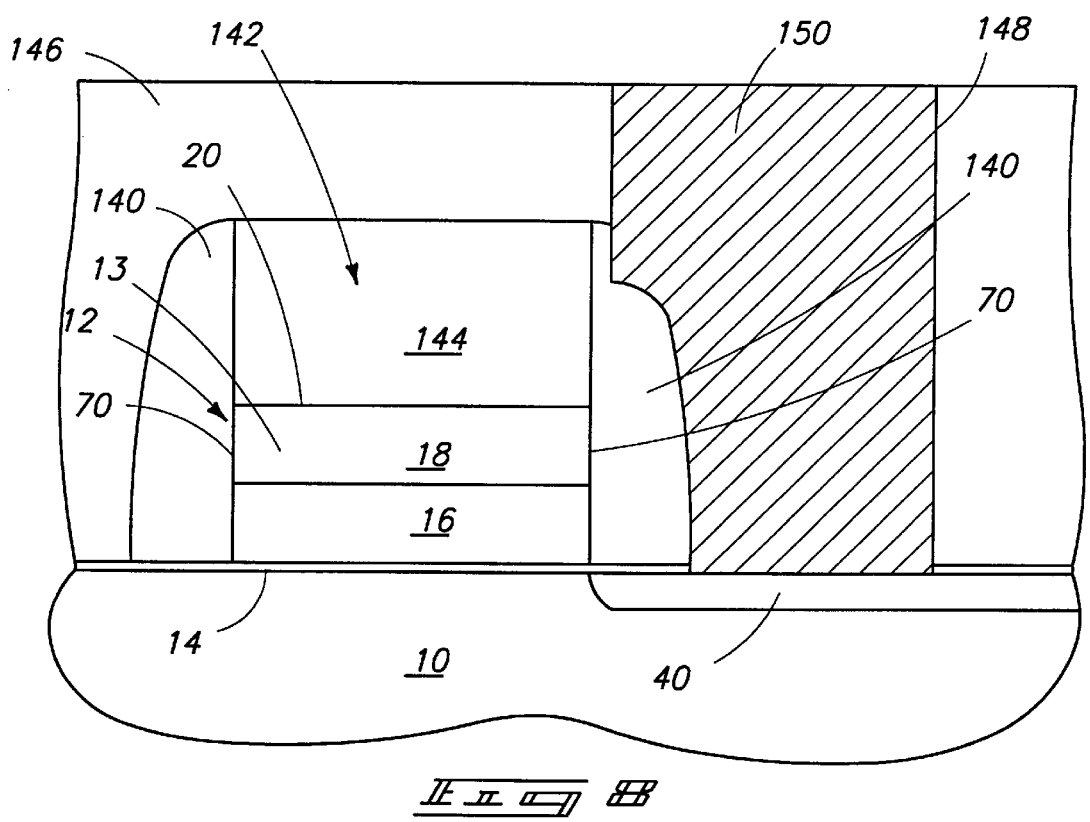
FIG. 8 is a diagrammatic section of the FIG. 1 wafer illustrated at an alternative processing step subsequent to that shown in FIG. 1.

Referring now to FIGS. 7 and 8, a second alternate form of the invention is shown. FIG. 7 illustrates a misalignment of a contact mask to a node location, whereas FIG. 8 illustrates undesired misalignment but which is not as onerous as shown in FIG. 7. In particular, the second form of the invention, as seen in FIG. 7, includes a semiconductor wafer in process 10 and a conductive line or electronic component 12 positioned thereon. The conductive line or electronic component 12 has a construction similar to that earlier disclosed. More precisely, the electronic component 12 comprises a polysilicon layer 16 which is formed outwardly of a gate oxide layer 14. Further, a tungsten silicide layer 18 is formed over the polysilicon layer 16. The conductive line or electronic component 12 has a top surface 20, and sidewalls 70.

A layer of nitride is formed over the conductive line 12, and is subsequently, anisotropically etched to form the resulting nitride sidewall 140 spacers. The electrically insulative nitride sidewall spacers 140 are formed over the conductive sidewall surface 70 and project outwardly of the conductive line top conductive surface 20. The resulting nitride sidewall spacers 140 define an elevational void 142 therebetween. A layer of oxide 144 (preferably Novellas or produced from decomposition of TEOS) is then formed over the top surface 20 of the electronic component and between the pair of nitride sidewall spacers 140 within void 142. An electrically insulative layer 146, preferably comprising BPSG, is formed outwardly of the conductive line 12 and over the adjacent node location 40. Thereafter, in the same masking step, a contact opening 148 is formed through the electrically insulative layer. The etching chemistry employed is selective relative to the nitride sidewall spacers 140. The etching chemistry employed (RIE) results in a lag time in the etch of material 144, thereby permitting misalignment of the mask. Therefore, electrical contact to the top surface 20 of the underlying conductive line 12 is avoided.

Accordingly, a method for forming a contact opening 148 of the present invention comprises providing a node location 40 to which electrical connection is to be made; forming a conductive line 12 adjacent the node location 40, the conductive line 12 having top 20 and sidewall surfaces 70; forming an electrically insulative oxide 144 in covering relation relative to the top surface 20 of the conductive line 12; forming electrically insulative nitride sidewall spacers 140 over the conductive sidewall surfaces 70; the nitride sidewall spacers 140 projecting outwardly of the conductive line top conductive surface 20, the electrically insulative oxide 144 positioned between the nitride sidewall spacers 140; forming an electrically insulative layer 146 outwardly of the conductive line 12, and node location 40; and etching a contact opening 148 to the node location 40 through the electrically insulative layer 146 substantially selective relative to the nitride sidewall 11 spacers 140. As seen in FIGS. 5 through 8, the method of the present invention provides a convenient means for making contact openings, in the same masking step, to both the node location 40, and the top surface 20 of the electronic component 11.

Still further, the method of the prevent invention results in an electronic component 12 comprising a main body 13 having sidewalls 70, and a top surface 20; a primary electrically insulative spacer 80 of a first material disposed in substantially covering relation relative to one of the sidewalls 70 of the electronic component 12, the primary electrically insulative spacer extending above the top surface 20 of the electronic component; and a secondary electrically insulative spacer 102 formed laterally inwardly relative to the primary electrically insulative spacer 80, the secondary insulative spacer 102 disposed in partial covering relation relative to the top surface 20 of the electronic component 12.

The invention as disclosed above is believed to be readily apparent and is briefly summarized at this point.

One aspect of the present invention relates to a method for forming first and second contact openings, comprising:

providing an electronic component 12 having a top surface 20 on a semiconductive substrate 10, the semiconductive substrate 10 having a node location 40 to which electrical contact is to be made;

forming a layer of insulative material 120 in covering relation relative to the electronic component 12; and in the same masking step, forming the first contact opening 132 through the layer of insulative material 120 to the top surface 20 of the electronic component 12, and the second contact opening 130 through the layer of insulative material 120 to the node location 40.

In accordance with another aspect of the present invention, a method for forming first and second contact openings comprises:

providing an electronic component 12 on a semiconductive substrate 10, the electronic component 12 having a sidewall 70 and a top surface 20, and the semiconductive substrate having a node location 40 to which electrical contact is to be made;

forming an insulative spacer 80 on the sidewall 70 of the electronic component 12, the insulative spacer 80 having a portion 81 which is disposed outwardly relative to the top surface 20 of the electronic component 12;

forming a first layer of material 50 in covering relation relative to the top surface 20 of the electronic component 12;

forming a second layer of insulative material 120 in covering relation relative to the electronic component 12 and the semiconductive substrate 10; and in the same masking step, forming the first contact opening 132 through the second layer of material 120 to the top surface 20 of the electronic component 12 and the second contact opening 130 through the second layer of material 120 to the node location 40.

Yet still another aspect of the present invention relates to a method for forming a contact opening comprising:

providing a node location 40 on a semiconductive substrate 10 to which electrical contact is to be made;

forming an electronic component 12 on the semiconductive substrate 10 adjacent to the node location 40, the electronic component 12 having sidewalls 70 and a top surface 20;

forming a first spacer 80 on at least one of the sidewalls 70 of the electronic component 12;

forming a second spacer 100 in partial covering relation relative to the top surface 20 of the electronic component 12;

forming an insulative layer of material 120 over the electronic component 12, the first and second spacers 80 and 100 and the node location 40; and selectively removing the insulative layer 120 relative to the first and second spacers 80 and 100 to form a contact opening 130 or 132 to the node location 40, or the top surface 20 of the electronic component 12.

Still another aspect of the present invention relates to a method for forming a contact opening comprising:

providing a node location 40 on a substrate 10 to which electrical contact is to be made;

providing an electronic component 12 on the substrate 10, and adjacent the node location 40, the electronic component 12 having sidewalls 70 and an electrically conductive top surface 20;

forming a first spacer 80 on at least one of the sidewalls 70 of the electronic component 12;

forming a second spacer 100 in partial covering relation relative to the top surface 20 of the electronic component 12;

forming an insulative layer of material 120 over the electronic component 12, the first and second spacers 80 and 100 and the node location 40; and selectively removing the insulative layer 120 relative to the first and second spacers 80 and 100 to form a contact opening 132 to the electrically conductive top surface 20 of the electronic component 12.

Another aspect of the present invention relates to a method for forming a contact opening to an electronic component 12, comprising:

providing an electronic component 12 having a top surface 20;

providing an electrically insulative spacer 100 in partial covering relation relative to the top surface 20;

providing an insulating layer 120 over the spacer 100 and the top surface 20; and selectively removing the insulative layer 120 relative to the spacer 100 to form a contact opening 132 to the electronic component 12 top surface 20.

Still a further aspect of the present invention relates to a method for forming first and second contact openings comprising:

providing a node location 40 to which electrical connection is to be made;

forming a conductive line 12 adjacent the node location 40, the conductive line 12 having conductive top 20 and sidewall surfaces 70;

forming a first material layer 50 over the conductive line 12 top surface 10;

forming electrically insulative sidewall spacers 80 of a second material over the conductive sidewall surfaces 70, the sidewall spacers 70 projecting outwardly of the conductive line 12 top surface 20, the electrically insulative first material 50 being provided between the sidewall spacers;

forming an electrically insulative layer 120 outwardly of the node location 40, the first material insulative layer 50, and second material sidewall spacers 80; and in the same masking step, etching a first contact opening 130 through the electrically insulative layer to the node location 40, and a second contact opening 132 to the conductive line conductive top surface 20, the etching being substantially selective relative to the second material of the sidewall spacers 80.

Yet still another aspect of the present invention relates to an electronic component comprising:

a main body 12 having sidewalls 70 and a top surface 20;

a primary electrically insulative spacer 80 of a first material disposed in substantially covering relation relative to one of the sidewalls 70 of the electronic component 12, the primary electrically insulative spacer 80 extending above the top surface of the electronic component 12; and a secondary electrically insulative spacer 100 provided laterally inwardly relative to the primary electrically insulative spacer 80, the secondary electrically insulative spacer 100 disposed in partial covering relation relative to the top surface 20 of the electronic component 12.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the Doctrine of Equivalents.

What is claimed is:

1. A method for forming a contact opening comprising:
   providing a node location to which electrical contact is to be made;
   forming an electronic component proximate the node location, the electronic component having a pair of opposing sidewalls and a top surface;
   forming a first spacer adjacent at least one of the sidewalls of the electronic component;
   forming a second spacer in partial covering relation relative to the top surface of the electronic component;
   forming an insulative layer of material over the electronic component, first and second spacers and the node location; and
   selectively etching the insulative layer relative to the first and second spacers to form a contact opening to at least one of the node location and the top of the electronic component.

2. A method as claimed in claim 1, wherein the first and second spacers comprise nitride, and wherein the first spacer extends above the top surface of the electronic component, and wherein the node location adjacent the electronic component and the top surface of the electronic component each have a given target area, and wherein the first and second spacers increase the size of each of the given target areas.

3. A method as claimed in claim 1, wherein the electronic component has opposite sidewalls, and individual first spacers are formed on the opposite sidewalls, the first spacers extending above the top surface of the electronic component.

4. A method as claimed in claim 1, wherein after forming the electronic component, and before forming the first spacer, forming a first layer of sacrificial material on the top surface of the electronic component.

5. A method as claimed in claim 4, wherein after forming the first spacer, selectively etching the first layer of sacrificial material relative to the first spacer.

6. A method as claimed in claim 1, wherein the first and second spacers comprise nitride.

7. A method as claimed in claim 4, wherein the first layer of sacrificial material comprises polysilicon.

8. A method as claimed in claim 5, wherein after selectively etching the first layer of sacrificial material, and before providing the insulative layer of material, the method comprises the steps of forming a third layer of material over the electronic component and the substrate; and
   selectively etching the third layer of material to form the second spacer.

9. A method as claimed in claim 1, wherein a first contact opening is formed to the node location and a second contact opening is formed to the top surface of the electronic component, and wherein each contact opening is formed in the same masking step.

10. A method for forming a contact opening comprising:
    providing a node location to which electrical contact is to be made;
    providing an electronic component proximate the node location, the electronic component having sidewalls and an electrically conductive top surface;
    forming a first spacer adjacent at least one of the sidewalls of the electronic component;
    forming a second spacer in partial covering relation relative to the top surface of the electronic component;
    forming an insulative layer of material over the electronic component, first and second spacers and the node location; and
    selectively etching the insulative relative to the first and second spacers to form a contact opening to the electrically conductive top surface of the electronic component.

11. A method as claimed in claim 10, wherein selectively etching the insulative layer further comprises forming a contact opening to the node location.

12. A method as claimed in claim 10, wherein the first and second spacers comprise nitride, and wherein the first spacer extends above the top surface of the electronic component.

13. A method as claimed in claim 10, wherein the electronic component has opposite sidewalls, and individual first spacers are provided on the opposite sidewalls, the first spacers extending above the top surface of the electronic component, and wherein the node location and the top surface have a given target area, and wherein the first and second spacers increase the given target areas of the respective node location, and top surface.

14. A method as claimed in claim 10, wherein after forming the electronic component, and before forming the first spacer, forming a first layer of sacrificial material on the top surface of the electronic component.

15. A method as claimed in claim 10, wherein after forming the first spacer, selectively etching the first layer of sacrificial material relative to the first spacer.

16. A method as claimed in claim 10, wherein the first and second spacers comprise nitride.

17. A method as claimed in claim 14, wherein the first layer of sacrificial material comprises polysilicon.

18. A method as claimed in claim 14, wherein after selectively etching the first layer of sacrificial material, and before forming the insulative layer of material, forming a third layer of material in covering relation relative to the electronic component and the substrate, and selectively etching the third layer of material to form the second spacer.

19. A method for forming a contact opening to an electronic component, comprising:
    forming an electronic component having a top surface;
    forming an electrically insulative spacer in partial covering relation relative to the top surface;
    forming an insulating layer over the spacer and the top surface; and
    selectively removing the insulative layer relative to the spacer to form a contact opening to the electronic component top surface.

20. A method as claimed in claim 19, wherein the electronic component is formed on a semiconductive substrate, and wherein a node location is formed in the semiconductive substrate, and wherein a contact opening is also formed to the node location.

21. A method as claimed in claim 19, wherein after forming the electronic component and before forming the spacer, forming a first layer of sacrificial material over the top surface of the electronic component.

22. A method as claimed in claim 21, wherein the electronic component has opposite sidewalls, and wherein after forming the first layer of sacrificial material, and before forming the spacer, forming an insulative sidewall spacer covering at least one of the sidewalls of the electronic component.

23. A method as claimed in claim 22, wherein the sidewall spacer extends above the top surface of the electronic component.

24. A method as claimed in claim 22, wherein individual sidewall spacers are formed on the opposite sidewalls and extend above the top surface of the electronic component, and wherein the first layer of sacrificial material is formed between the sidewall spacers, and wherein the top surface of the electronic component has a given target area and the sidewall spacers effectively increase the given target area.

25. A method as claimed in claim 22, wherein after forming the first layer of sacrificial material and before forming the spacer, etching the first layer of sacrificial material selectively relative to the sidewall spacer.

26. A method as claimed in claim 25, wherein after selectively etching the first layer of sacrificial material, forming a second layer of material over the electronic component and selectively etching the second layer of material to form the spacer in partial covering relation relative to the top surface.

27. A method as claimed in claim 22, wherein the spacer comprises nitride.

28. A method as claimed in claim 22, wherein the first layer of sacrificial material comprises polysilicon.

29. A method for forming a contact opening, comprising:
providing a node location to which electrical connection is to be made, and a conductive line adjacent the node location, the conductive line having conductive top and sidewall surfaces;
forming electrically insulative oxide in covering relation relative to the top surface of the conductive line;
forming electrically insulative nitride sidewall spacers over the conductive sidewall surfaces, the nitride sidewall spacers projecting outwardly of the conductive line top conductive surface, the electrically insulative oxide positioned between the nitride sidewall spacers;
forming an electrically insulative layer outwardly of the conductive line and node location; and
etching a contact opening to the node location through the electrically insulative layer, said etching being substantially selective relative to the nitride sidewall spacers.

30. A method for forming a contact opening, comprising:
providing a node location to which electrical connection is to be made;
forming a conductive line adjacent the node location, the conductive line having conductive top and sidewall surfaces;
forming a first material over the conductive line top surface;
forming electrically insulative sidewall spacers of a second material over the conductive sidewall surfaces, the sidewall spacers projecting outwardly of the conductive line top surface, the first material being received between the sidewall spacers;
forming an electrically insulative layer outwardly of the node location, first material layer and second material sidewall spacers; and
etching a contact opening to the node location through the electrically insulative layer substantially selectively relative to the second material of the sidewall spacers.

31. A method as claimed in claim 30, wherein the first material comprises substantially undoped oxide.

32. A method as claimed in claim 30, wherein the second material comprises nitride.

33. A method for forming a contact opening comprising:
providing an electrical node location;
providing a conductive line proximate the node location, the conductive line having a pair of opposing sidewalls and a top surface;
forming a first spacer extending along one of the sidewalls of the conductive line and to over the top surface of the conductive line;
forming a second spacer over a portion of the top surface of the conductive line and contacting the first spacer above the top surface of the conductive line;
forming an insulative layer of material over the conductive line, first and second spacers and the node location; and
selectively etching the insulative layer relative to the first and second spacers to form an opening extending to either the node location or the top surface of the conductive line.

34. The method of claim 33 wherein a pair of the first spacers are formed, one of the first spacers extending along one of the opposing sidewalls and the other of the first spacers extending along the other of the opposing sidewalls.

35. The method of claim 33 wherein:
a pair of the first spacers are formed, one of the first spacers extending along one of the opposing sidewalls and the other of the first spacers extending along the other of the opposing sidewalls; and
a pair of the second spacers are formed, one of the second spacers contacting said one of the pair of first spacers and the other of the second spacers contacting said other of the pair of first spacers, the pair of second spacers together covering only part of the top surface and leaving an other part uncovered.

36. The method of claim 35 further comprising, before forming the insulative layer, forming a layer of silicon dioxide over the uncovered other part of the top surface.

37. A method for forming a contact opening comprising:
providing an electrical node location;
providing a conductive line proximate the node location, the conductive line having sidewalls and an electrically conductive top surface;
forming a first spacer adjacent one of the sidewalls of the conductive line;
forming a second spacer over only a portion of the top surface of the conductive line and contacting the first spacer;
forming an insulative layer of material over the conductive line, first and second spacers and the node location; and
selectively etching the insulative layer relative to the first and second spacers to form a contact opening to the electrically conductive top surface.

* * * * *

UNITED STATES PATENT AND TRADEMARK OFFICE
CERTIFICATE OF CORRECTION

PATENT NO. : 6,261,948 B1  Page 1 of 1
DATED : July 17, 2001
INVENTOR(S) : Charles H. Dennison It is certified that error appears in the above-identified patent and that said Letters Patent is hereby corrected as shown below:

<u>Column 4,</u>
Line 47, delete "11".

<u>Column 7,</u>
Line 25, replace "top" with -- top surface --.

<u>Column 8,</u>
Line 8, replace "insulative" with -- insulative layer --.

Signed and Sealed this

Twenty-ninth Day of July, 2003

JAMES E. ROGAN
*Director of the United States Patent and Trademark Office*